(12) United States Patent
Joo et al.

(10) Patent No.: US 9,184,413 B2
(45) Date of Patent: Nov. 10, 2015

(54) FLAT PANEL DISPLAY DEVICE AND MANUFACTURING METHOD THEREOF

(71) Applicant: Samsung Display Co., Ltd., Yongin, Gyeonggi-Do (KR)

(72) Inventors: Sung-Joong Joo, Yongin (KR); Myung-Soo Huh, Yongin (KR); Suk-Won Jung, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 273 days.

(21) Appl. No.: 13/670,095

(22) Filed: Nov. 6, 2012

(65) Prior Publication Data

US 2013/0328480 A1    Dec. 12, 2013

(30) Foreign Application Priority Data

Jun. 11, 2012 (KR) .................. 10-2012-0062352

(51) Int. Cl.
    *H05B 33/04* (2006.01)
    *H05B 33/10* (2006.01)
    *H01L 51/52* (2006.01)

(52) U.S. Cl.
    CPC ............ *H01L 51/5256* (2013.01); *H05B 33/04* (2013.01); *H05B 33/10* (2013.01)

(58) Field of Classification Search
    CPC . H01L 51/5237; H01L 27/3246; H01L 51/56; H01L 51/5246; H01L 27/3283; H01L 2251/566; H01L 51/524; H01L 51/5253; H01L 21/02304; H01L 23/02; H01L 23/28; H01L 23/3192; H01L 27/15–27/156; H01L 27/32–27/3297; H05B 33/04; H05B 33/10; H01B 51/5256
    USPC .............................. 313/498–512; 445/23–25
    See application file for complete search history.

(56) References Cited

U.S. PATENT DOCUMENTS

| | | | |
|---|---|---|---|
| 7,838,880 B2 | 11/2010 | Kwak et al. | |
| 2006/0220056 A1 | 10/2006 | Lee | |
| 2007/0178796 A1 | 8/2007 | Kwak | |
| 2009/0179566 A1* | 7/2009 | Imamura ..................... 313/512 |
| 2011/0006972 A1* | 1/2011 | Tanaka ......................... 345/76 |
| 2011/0042702 A1 | 2/2011 | Lim et al. | |
| 2012/0055692 A1 | 3/2012 | Tanino et al. | |

FOREIGN PATENT DOCUMENTS

| KR | 10-2006-0104531 | 10/2006 |
| KR | 10-0708645 | 4/2007 |
| KR | 10-0730220 | 6/2007 |
| KR | 10-2011-0019195 | 2/2011 |

* cited by examiner

*Primary Examiner* — Anh Mai
*Assistant Examiner* — Nathaniel Lee
(74) *Attorney, Agent, or Firm* — Robert E. Bushnell, Esq.

(57) ABSTRACT

A flat panel display device provides a sealing structure for comprising and sealing a display unit disposed in a first region on a substrate. The display unit includes the first region and a second region, and a barrier is disposed in the first region on the substrate, on an outer side of the display unit, and adjacent to the second region. The sealing structure contacts the barrier, and includes at least one first layer of an inorganic material and at least one second layer of an organic material. A method of manufacturing the flat panel display device is also disclosed.

16 Claims, 7 Drawing Sheets

FLAT PANEL DISPLAY DEVICE AND MANUFACTURING METHOD THEREOF

CLAIM OF PRIORITY

This application makes reference to, incorporates the same herein, and claims all benefits accruing under 35 U.S.C. §119 from an application earlier filed in the Korean Intellectual Property Office on the 11 Jun. 2012 and there duly assigned Serial No. 10-2012-0062352.

BACKGROUND OF THE INVENTION b 1. Field of the Invention

The present invention relates to a flat panel display device and a manufacturing method thereof.

2. Description of the Related Art

Flat panel display devices, in particular, organic light-emitting display devices, are very vulnerable to external elements, for example, oxygen, moisture, etc. Accordingly, flat panel display devices need to have a sealing structure for sealing an organic emission unit from external elements.

In this regard, however, a region of the organic emission unit needs to be opened, which involves a plurality of masks, and thus flat panel display devices suffer from processing and/or cost.

In addition, when the sealing structure is formed as a film type, flat panel display devices are vulnerable to oxygen and moisture infiltrating from boundary sides thereof.

SUMMARY OF THE INVENTION

According to an aspect of the present invention, there is provided a flat panel display device including: a substrate including a first region and a second region; a display unit disposed in the first region on the substrate; a barrier disposed in the first region on the substrate, disposed on an outer side of the display unit, and disposed adjacent to the second region; and a sealing structure for covering and sealing the display unit, including at least one first layer which includes an inorganic material and at least one second layer which includes an organic material, and contacting the barrier.

The first layer of the sealing structure may be disposed on the barrier.

The second layer of the sealing structure may not be disposed on the barrier.

The barrier may be spaced apart from the display unit.

A thickness of the barrier may be greater than a thickness of the sealing structure.

The sealing structure may not be disposed in the second region.

The barrier may not be disposed in the second region.

A boundary of the sealing structure and a boundary of the barrier may contact each other.

A boundary of the barrier may contact a boundary of the second region.

The second region may include a boundary of the substrate or a pad portion electrically connected to the display unit.

According to another aspect of the present invention, there is provided a method of manufacturing a flat panel display device, the method including: preparing a substrate including a first region and a second region; forming a display unit disposed in the first region on the substrate; forming a barrier disposed in the first region on the substrate, disposed on an outer side of the display unit, and disposed adjacent to the second region; and forming a sealing structure for covering and sealing the display unit, including at least one first layer which includes an inorganic material and at least one second layer which includes an organic material, and contacting the barrier.

The forming of the barrier may include: forming a third layer in the first region and the second region; and exposing the second region by patterning the third layer.

The forming of the sealing structure may include: forming at least one first layer in the first region and the second region; forming at least one second layer in the first region and the second region; and exposing the second region by patterning the first layer(s) and the second layer(s).

The forming of the sealing structure may include forming the first(s) layer so as to cover the patterned third layer.

The forming of the sealing structure may include forming the second layer(s) so as not to cover the patterned third layer.

A thickness of the third layer may be greater than a thickness of the sealing structure.

The second region may include a boundary of the substrate or a pad portion electrically connected to the display unit.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Hereinafter, the present invention will be described more fully with reference to the accompanying drawings, in which exemplary embodiments of the invention are shown. As used herein, the term "and/or" includes any and all combinations of one or more of the associated listed items. Expressions such as "at least one of", when preceding a list of elements, modify the entire list of elements and do not modify the individual elements of the list.

Figure 1:
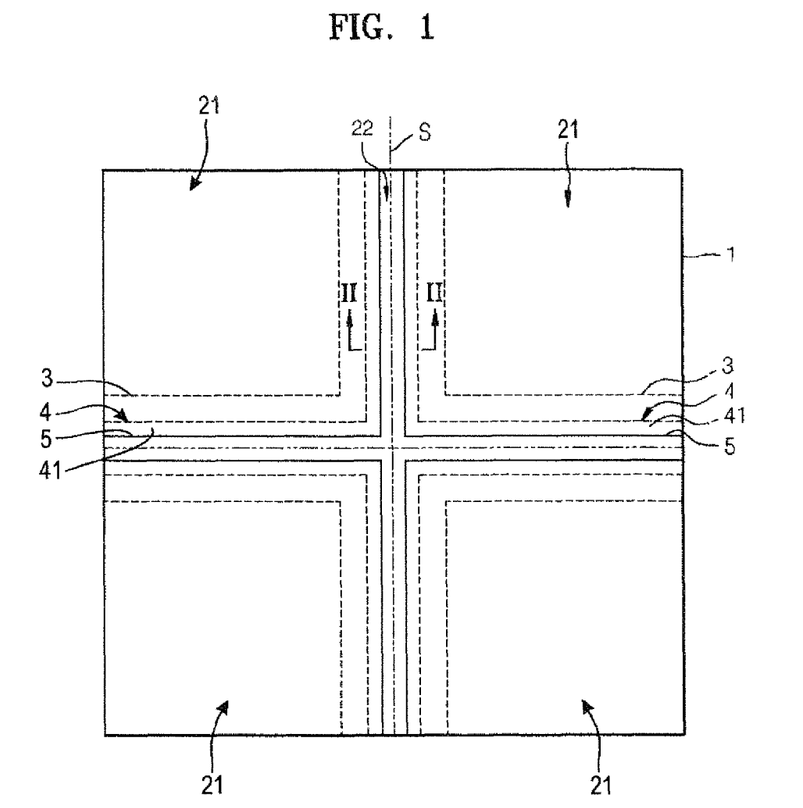
FIG. 1 is a schematic partial plan view of an organic light-emitting display device according to an embodiment of the present invention.
Figure 2:
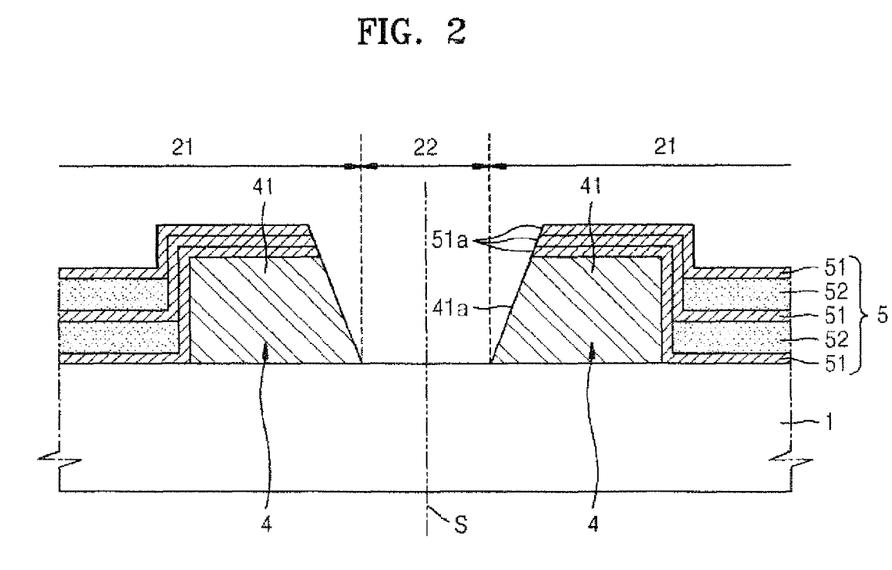
FIG. 2 is a cross-sectional view of an example of a portion II of FIG. 1.
Figure 3:
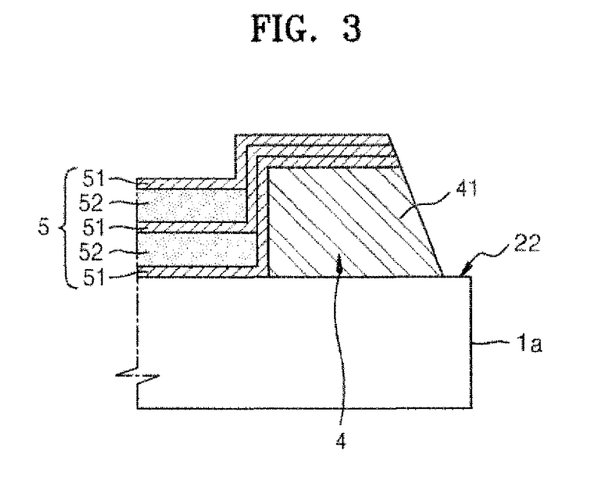
FIG. 3 is a cross-sectional view of a substrate cut along a cutting line of FIG. 2.
Figure 4:
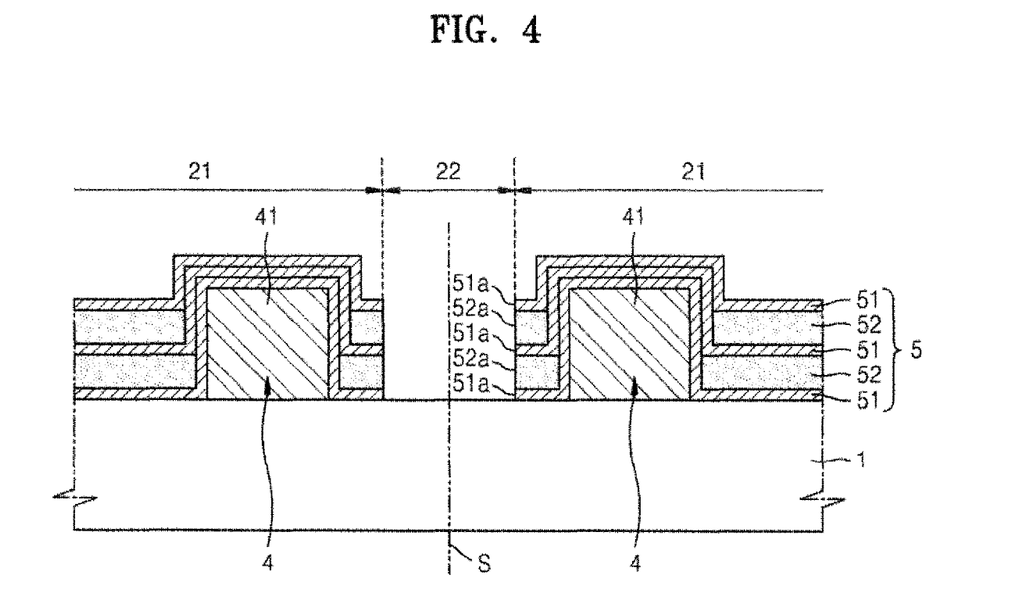
FIG. 4 is a cross-sectional view of another example of the portion II of FIG. 1.

FIG. 1 is a schematic partial plan view of an organic light-emitting display device according to an embodiment of the present invention, FIG. 2 is a cross-sectional view of a portion II of FIG. 1, FIG. 3 is a cross-sectional view of a substrate cut along a cutting line of FIG. 2, and FIG. 4 is a cross-sectional view of another example of the portion II of FIG. 1.

FIGS. 1 and 2 show a plurality of organic light-emitting display devices formed on a substrate 1. The substrate 1 is cut along a cutting line S and is split into the plurality of organic light-emitting display devices. Thus, the substrate 1 may be a mother board for forming the plurality of organic light-emitting display devices.

The substrate 1 includes first regions 21 and a second region 22 disposed at locations corresponding to the plurality of organic light-emitting display devices. The substrate 1 may include a plurality of first regions 21 disposed independently from each other with respect to the plurality of organic light-emitting display devices. The second region 22 may be disposed between the first regions 21. However, the present invention is not limited thereto.

The substrate 1 may be formed of glass, plastic, or metal. Although not shown in FIG. 2, the substrate 1 may further include a buffer layer formed as an insulator on a top surface of the substrate 1.

The second region 22 includes the cutting line S of the substrate 1.

A display unit 3 is disposed in each of the first regions 21 and is formed on the substrate 1. The display unit 3 forms a display image.

A barrier 4 is disposed at an outer side of each of the display units 3 and is formed on the substrate 1. The barrier 4 includes a first barrier 41. The barrier 4 may include an inorganic material and/or an organic material. The barrier 4 may include an insulator and/or a conductor.

The first barrier 41 is disposed adjacent to the second region 22, including the cutting line S, in each of the first regions 21.

As shown in FIG. 2, a boundary of the first barrier 41 contacting the substrate 1 may contact a boundary of the second region 22.

The first barrier 41 is not disposed in the second region 22, and thus the second region 22 of the substrate 1 is exposed.

As shown in FIG. 1, the first barrier 41 is spaced apart from the display unit 3 by a predetermined gap. Accordingly, a sealing structure 5 may sufficiently seal the display unit 3.

As shown in FIG. 1, a thickness of the first barrier 41 may be greater than a thickness of the sealing structure 5. Accordingly, infiltration of moisture/oxygen into side surfaces of the sealing structure 5 may be blocked.

The sealing structure 5 is formed as a film type to seal the display unit 3 from external moisture/oxygen. To this end, the sealing structure 5 has a wider area than the display unit 3, and is formed on the display unit 3 so as to cover the display unit 3.

The sealing structure 5 includes at least one first layer 51 and at least one second layer 52. The first layer 51 includes an inorganic material. The second layer 52 includes an organic material.

The inorganic material of the first layer 51 may include one or more of silicon oxide, silicon nitride, silicon oxynitride, aluminum oxide, aluminum nitride, aluminum oxynitride, tin oxide, phosphorus oxide, boron phosphate, tin fluoride, niobium oxide, and tungsten oxide. However, the present invention is not limited thereto.

The organic material of the second layer 52 may include acryl or polyimide. However, the present invention is not necessarily limited thereto.

The first layers 51 and the second layers 52 may be alternately formed. In FIG. 2, three-layer first layers 51 are formed, and the second layers 52 are disposed between the first layers 51. However, the present invention is not necessarily limited thereto. The number of first layers 51 and second layers 52 may be modified. However, the first layers 51 including an inorganic material may be disposed at an outermost boundary.

The first layers 51 of the sealing structure 5 may extend above the first barrier 41. The second layers 52 may not be disposed on the first barrier 41. Accordingly, the first layers 51 only contact each other on the first barrier 41, thereby further increasing a moisture/oxygen infiltration block effect in a region in which the first barrier 41 and the sealing structure 5 contact each other.

The sealing structure 5 is not disposed in the second region 22, and thus the second region 22 of the first substrate 1 is exposed. To this end, a boundary of the sealing structure 5, for example, boundaries 51a of the first layers 51, may contact a boundary of a side surface 41a of the first barrier 41. As will be described later, such a structure will be realized by simultaneously patterning the first layers 51 and the first barrier 41.

The substrate 1 is cut along the cutting line S after the cutting line S of the first substrate 1 is exposed in the second region 22, and thus a shape as shown in FIG. 3 may be obtained.

In this case, a boundary 1a of the cut substrate 1 is included in the second region 22 (see FIG. 3).

In the present embodiment, the first barrier 41 is formed along an outermost boundary of the substrate 1, thereby preventing side surfaces of the sealing structure 5 from being exposed to external air, and accordingly further increasing sealing characteristics with respect to the display unit 3.

The first layers 51 are disposed on the first barrier 41 and the second layers 52 are disposed only on the substrate 1, thereby further increasing an effect of blocking oxygen/moisture from the first barrier 41. As described above, the first layers 51 including an inorganic material contact each other, and thus adhesion therebetween may be relatively excellent.

During a process of exposing the second region 22 of the substrate 1, the first barrier 41 constitutes a blocking wall, thereby reducing a risk that the sealing structure 5 or the display unit 3 is damaged from wet and/or dry etching.

Although the boundary of the first barrier 41 contacts the boundary of the second region 22 in FIG. 2, the present invention is not necessarily limited thereto. As shown in FIG. 4, the boundary of the sealing structure 5 may contact the boundary of the second region 22. In this regard, the boundaries 51a of the first layers 51 and boundaries 52a of the second layers 52 contact the boundary of the second region 22.

However, in this case, the first layers 51 may be disposed on the first barrier 41 so as to contact each other, and the second layers 52 may not be disposed on the first barrier 41.

Figure 5:
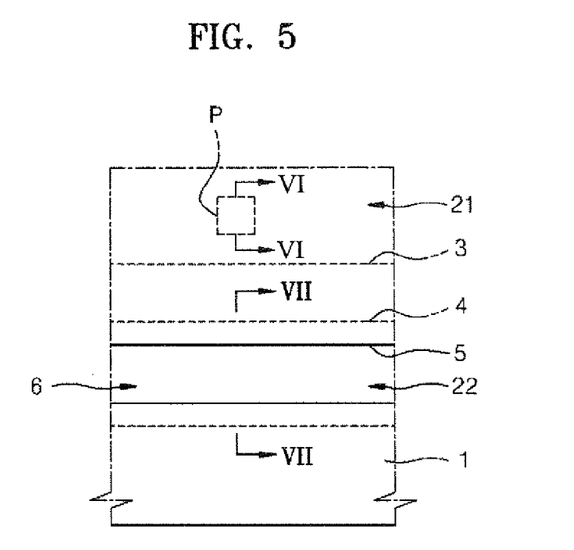
FIG. 5 is a schematic partial plan view of an organic light-emitting display device according to another embodiment of the present invention.
Figure 6:
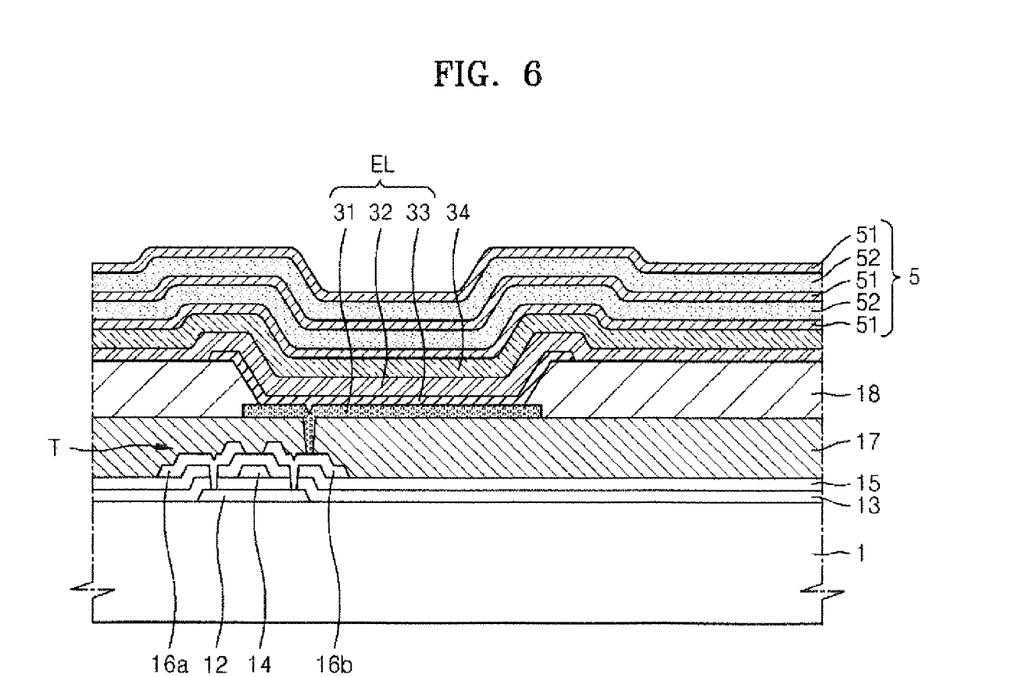
FIG. 6 is a partial cross-sectional view of a portion VI-VI of FIG. 5.
Figure 7:
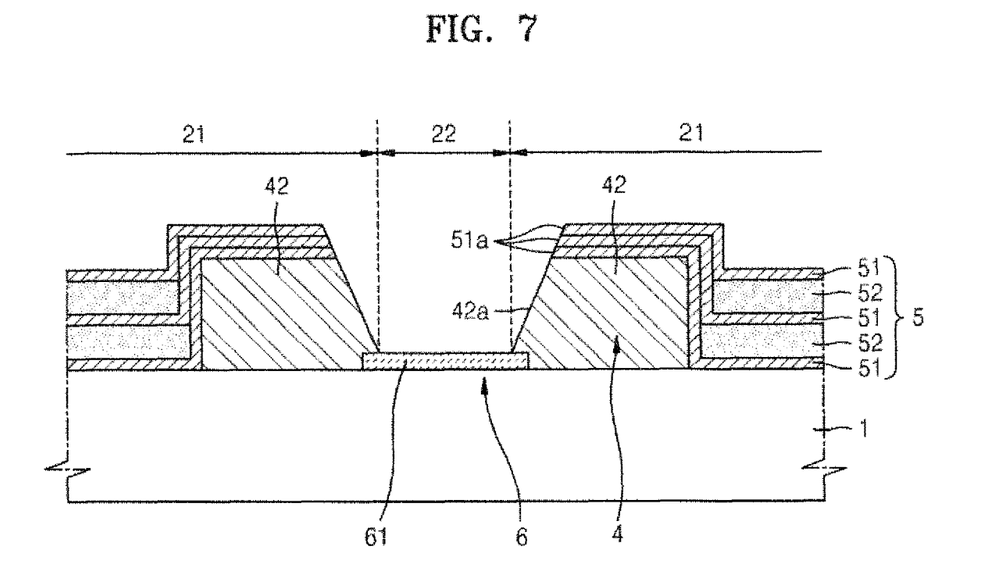
FIG. 7 is a partial cross-sectional view of a portion VII-VII of FIG. 5.

FIG. 5 is a schematic partial plan view of an organic light-emitting display device according to another embodiment of the present invention. FIG. 6 is a partial cross-sectional view of a portion VI-VI of FIG. 5. FIG. 7 is a partial cross-sectional view of a portion VII-VII of FIG. 5.

Referring to FIG. 5, the substrate 1 includes the first regions 21 and the second region 22. A pad portion 6 is disposed in the second region 22.

FIG. 6 shows a cross-section of a pixel P of FIG. 5.

The pixel P includes a pixel circuit unit that may include at least one thin film transistor T and a capacitor (not shown).

A semiconductor active layer 12 is formed on the substrate 1.

The semiconductor active layer 12 may be formed of amorphous/polycrystalline silicon, but the present invention is not limited thereto. The semiconductor active layer 12 may be formed of an oxide semiconductor. For example, the semiconductor active layer 12 maybe a G-I-Z-O layer [$(In_2O_3)a(Ga_2O_3)b(ZnO)c$ layer] (a, b, and c, respectively, are real numbers satisfying conditions of a≥0, b≥0, and c 0).

A gate insulation layer 13 is formed on the substrate 1 so as to cover the semiconductor active layer 12. A gate electrode 14 is formed on the gate insulation layer 13.

An interlayer insulation layer 15 is formed on the gate insulation layer 13 so as to cover the gate electrode 14. A source electrode 16a and a drain electrode 16b are formed on the interlayer insulation layer 15 so as to contact the semiconductor active layer 12 through contact holes.

The thin film transistor T is not necessarily limited to such a structure. The thin film transistor T may have various structures.

A first insulation layer 17 is formed so as to cover the thin film transistor T. The first insulation layer 17 may be a single layer or multiple layers of an insulation layer having a planar top surface. The first insulation layer 17 may be formed of an organic material and/or an inorganic material.

As is shown in FIG. 6, a first electrode 31 of an organic light emitting diode (EL) electrically connected to the thin film transistor T is formed on the first insulation layer 17. The first electrode 31 is formed in an island shape independently for each pixel.

A second insulation layer 18 is formed on the first insulation layer 17 so as to cover a boundary of the first electrode 31. A center part of the first electrode 31, excluding the boundary thereof, is exposed through an opening formed in the second insulation layer 18. The second insulation layer 18 may be formed of an organic material such as acryl, polyimide, etc.

The first electrode 31 and a second electrode 32 face each other, and are insulated from each other by an organic emission layer 33. The second electrode 32 may be at least a common electrode covering all pixels. The first electrode 31 may be independently formed in each pixel.

The first electrode 31 may be formed by providing a top portion of the first insulation layer 17 with a first electrode material by deposition or sputtering, etc. In a case where the first electrode 31 is an anode, the first electrode material may be selected from materials having a high work function so as to facilitate a hole injection. The first electrode 31 may be a reflective type electrode, a semi-transmissive type electrode, or a transmissive type electrode. The first electrode material may use indium tin oxide (ITO), indium zinc oxide (IZO), tin oxide ($SnO_2$), zinc oxide (ZnO), etc. so as to have transparency and excellent conductivity. Alternatively, the first electrode 31 may further include a reflective layer using magnesium (Mg), aluminum (Al), aluminum-lithium (Al—Li), magnesium-indium (Mg—In), magnesium-silver (Mg—Ag), etc.

The first electrode 31 may have a single layer structure or a structure having two or more layers. For example, the first electrode 31 may have a three layer structure of ITO/Ag/ITO. However, the present invention is not limited thereto.

The organic emission layer 33 is formed on a top portion of the first electrode 31.

The organic emission layer 33 may include one or more layers of a hole injection layer, a hole transport layer, a function layer simultaneously having a hole injection function and a hole transport function, a buffer layer, an electron blocking layer, an emission layer, a hole blocking layer, an electron transport layer, and an electron injection layer.

For example, the organic emission layer 33 may include at least one of compounds 301, 311, and 321 below.

301

311

321

The second electrode 32 is disposed on a top portion of the organic emission layer 33. The second electrode 32 may be a cathode, that is, an electron injection electrode. In this regard, a second electrode forming metal may use a metal having a low work function, an alloy, an electrical conductive compound, and a mixture of these. As a specific example, a reflective type electrode, a semi-transmissive type electrode, or a transmissive type electrode may be obtained by forming lithium (Li), magnesium (Mg), aluminum (Al), aluminum-lithium (Al—Li), calcium (Ca), magnesium-indium (Mg—In), magnesium-silver (Mg—Ag), etc. as a thin film. Meanwhile, various modifications may be possible, for example, the transmissive type electrode may be formed using ITO, IZO, etc. in order to obtain a top emission device.

In a bottom emission type organic light-emitting display device in which an image is formed toward the substrate 1, the second electrode 32 may have a relatively great thickness so that emission efficiency toward the substrate 1 may be increased.

In a top emission type organic light-emitting display device in which an image is formed toward the second electrode 32, the second electrode 32 may have a relatively small thickness, and the second electrode 32 may be a semi-transmissive reflective layer, or the second electrode 32 may be formed of a transparent conductive material in addition to the above-described materials. In this case, the first electrode 31 may further include a reflective layer.

A protection layer 34 may be disposed on a top portion of the second electrode 32. The protection layer 34 may prevent the second electrode 32 from being damaged. For example, the protection layer 34 may be formed of materials such as LiF, lithium quinolate, Alq3, or the like.

The sealing structure 5, including the plurality of first layers 51 and the plurality of second layers 52, is formed on the protection layer 34.

Meanwhile, FIG. 7 shows a pad portion 6 exposed on the second region 22. The pad portion 6 may be electrically connected to the display unit 3.

The second region 22 including the pad portion 6 may be disposed at an outer boundary of the first regions 21. However, the present invention is not necessarily limited thereto.

The barrier 4 is disposed at an outer side of each of the display units 3 and is formed on the substrate 1. The barrier 4 includes a second barrier 42 in the embodiment of FIGS. 5 and 7. The second barrier 42 is disposed adjacent to the second region 22 in each of the first regions 21.

As shown in FIG. 7, a boundary of the second barrier 42 contacting the substrate 1 may contact the boundary of the second region 22.

The second barrier 42 is not disposed in the second region 22, and thus the pad portion 6 is exposed in the second region 22. A pad 61 is formed in the pad portion 6 so as to be electrically connected to an external circuit apparatus. Although not shown, a plurality of pads 61 may be formed in the pad portion 6.

As shown in FIG. 5, the second region 22 is spaced apart from the display unit 3 by a predetermined gap. As shown in FIG. 7, a thickness of the second barrier 42 may be greater than a thickness of the sealing structure 5. Accordingly, infiltration of moisture/oxygen into side surfaces of the sealing structure 5 may be blocked.

A detailed description of the sealing structure 5 is the same as described in the previous embodiment, and thus it is omitted here.

The first layers 51 of the sealing structure 5 may extend above the second barrier 42. The second layers 52 may not be disposed on the second barrier 42. Accordingly, the first layers 51 only contact each other on the second barrier 42, thereby further increasing a moisture/oxygen infiltration block effect in a region in which the second barrier 42 and the sealing structure 5 contact each other.

The sealing structure 5 is not disposed in the second region 22, and thus the pad portion 6 is exposed in the second region 22. To this end, the boundary of the sealing structure 5, for example, the boundaries 51a of the first layers 51, may contact a boundary of a side surface 42a of the second barrier 42. As will be described later, such a structure will be realized by simultaneously patterning the first layers 51 and the second barrier 42.

The first layers 51 are disposed on the second barrier 42 and the second layers 52 are disposed only on the substrate 1, thereby further increasing an effect of blocking oxygen/moisture from the second barrier 42. As described above, the first layers 51 including an inorganic material contact each other, and thus adhesion therebetween may be further excellent.

During a process of exposing the pad portion 6 in the second region 22, the second barrier 42 constitutes a blocking wall, thereby reducing a risk that the sealing structure 5 or the display unit 3 is damaged from wet and/or dry etching.

Although the second barrier 42 covers a boundary of the pad 61 in FIG. 7, the present invention is not necessarily limited thereto. The second barrier 42 may be spaced apart from the pad 61.

FIGS. 8A through 8G are cross-sectional views for describing a manufacturing method of the embodiment of FIG. 2.

Figure 8A:
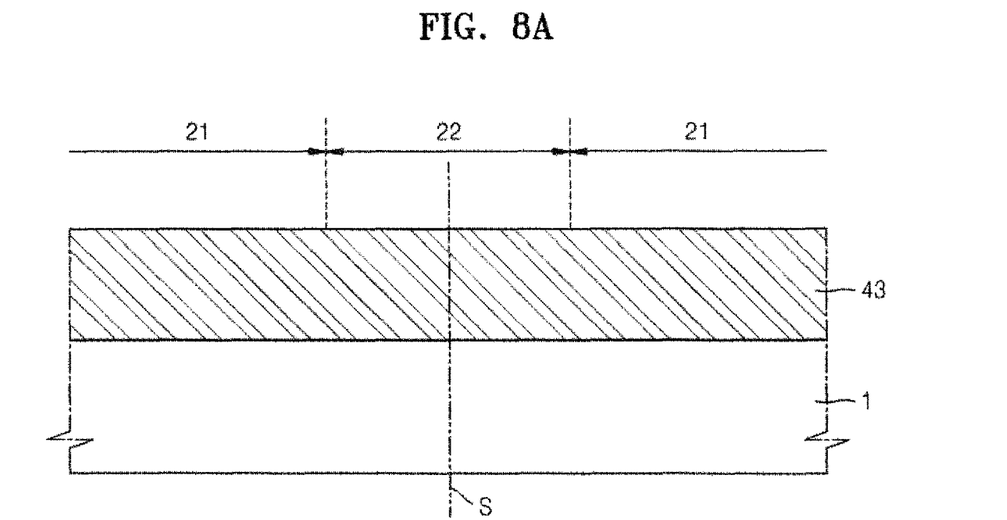
FIGS. 8A through 8G are cross-sectional views for describing a manufacturing method of the embodiment of FIG. 2.

Referring to FIG. 8A, a third layer 43 is formed on the substrate 1.

The third layer 43 may be formed of an organic material and/or an inorganic material. The third layer 43 may be formed as an insulator and/or a conductor. The third layer 43 may be formed simultaneously with at least one of the gate insulation layer 13, the interlayer insulation layer 15, the first insulation layer 17, and the second insulation layer 18, and may be formed of the same material as the aforementioned layer(s).

Figure 8B:
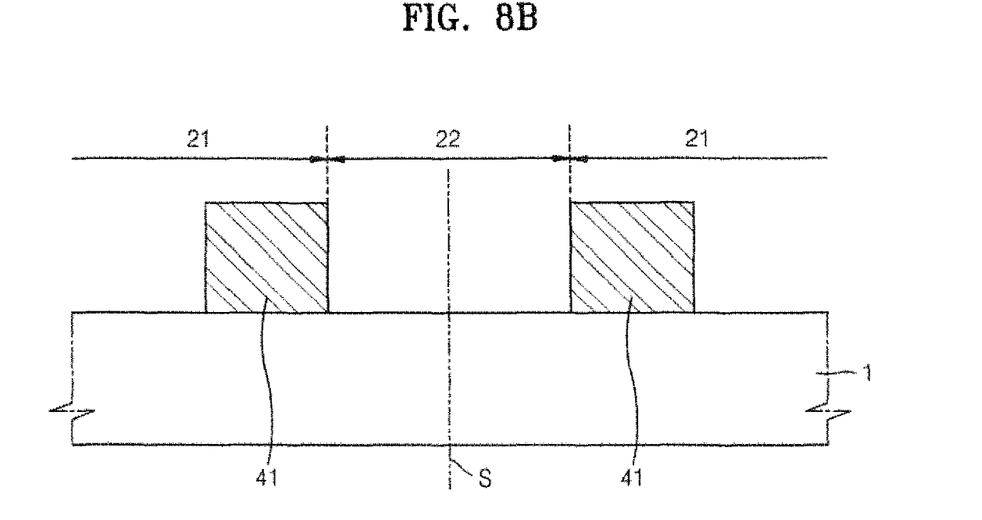

As shown in FIG. 8B, the first barriers 41 are formed by patterning the third layer 43 of FIG. 8A in such a way that the substrate 1 is exposed in the second region 22. Shapes of the first barriers 41 are the same as described above.

Figure 8C:
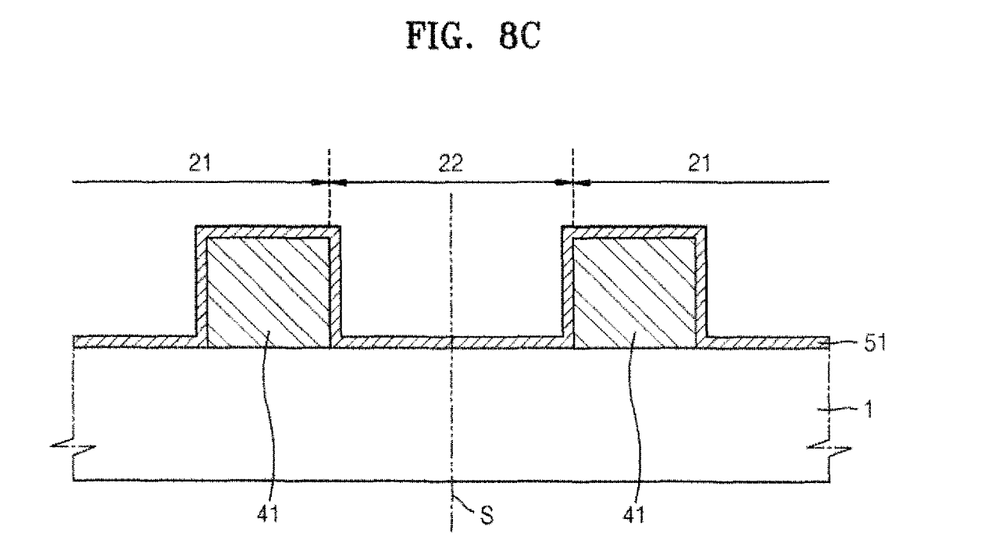

As shown in FIG. 8C, the first layer 51 is formed. In this regard, the first layer 51 is formed without a mask so that the first layer 51 may be simultaneously formed in both the first regions 21 and the second region 22. Thus, the first layer 51 covers the first barriers 41.

Figure 8D:
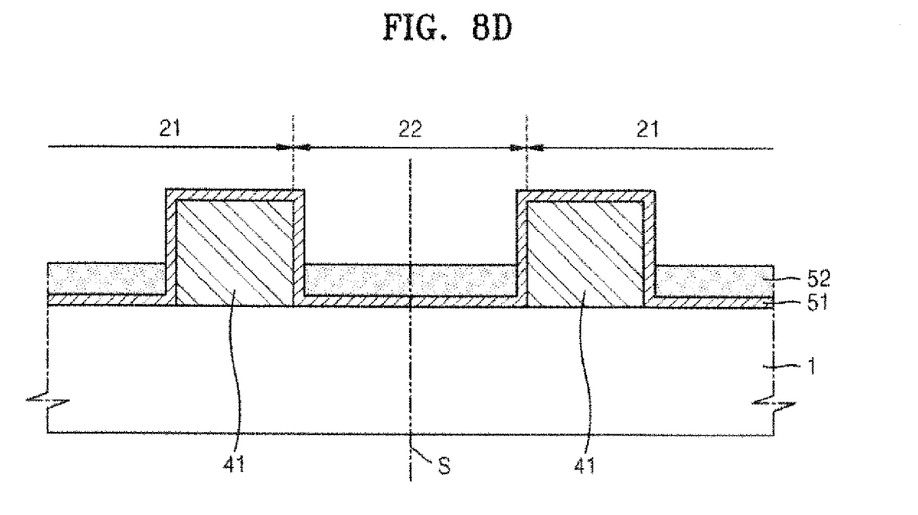

Next, as shown in FIG. 8D, the second layer 52 is formed. In this regard, the second layer 52 is formed without a mask so that the second layer 52 may be simultaneously formed in both the first regions 21 and the second region 22. The second layer 52 includes an organic material, and thus the second layer 52 may not be formed on the first barriers 41 through a process of planarizing the second layer 52. Thus, the second layer 52 may be filled in a valley between the two first barriers 41.

Figure 8E:
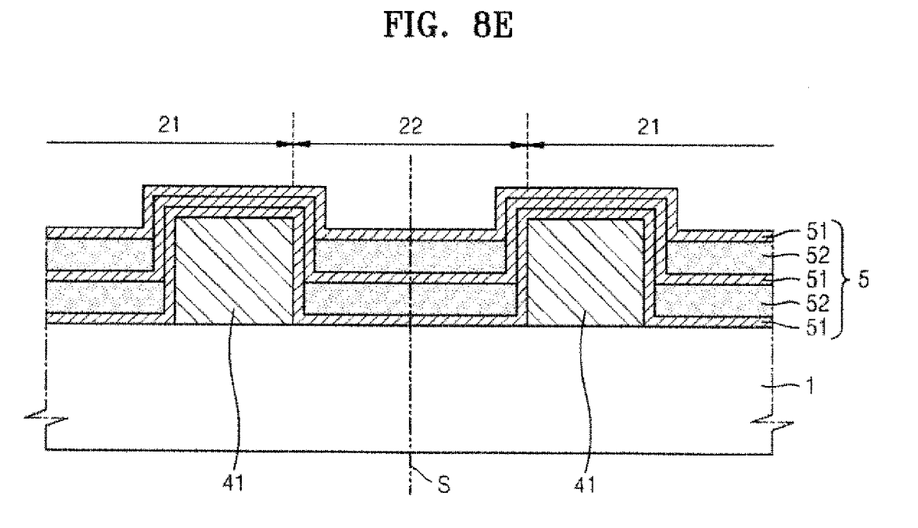

The first layer 51 and the second layer 52 may be further formed using the same method, and thus the sealing structure 5 is formed as shown in FIG. 8E.

Figure 8F:
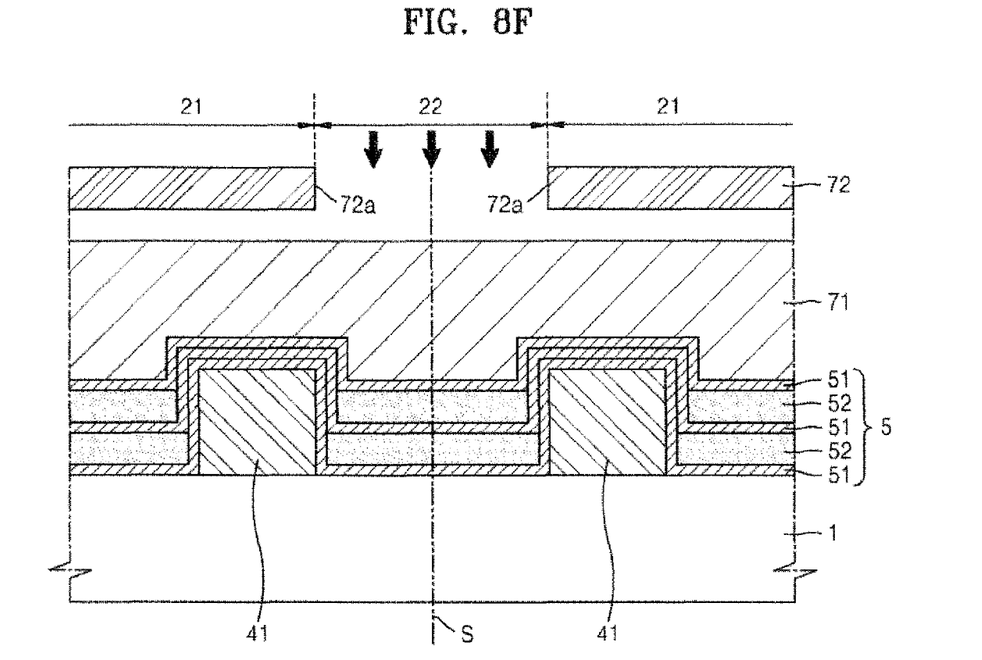

As shown in FIG. 8F, a photoresist 71 is formed so as to cover the sealing structure 5. The photoresist 71 is formed in both the first regions 21 and the second region 22.

Figure 8G:
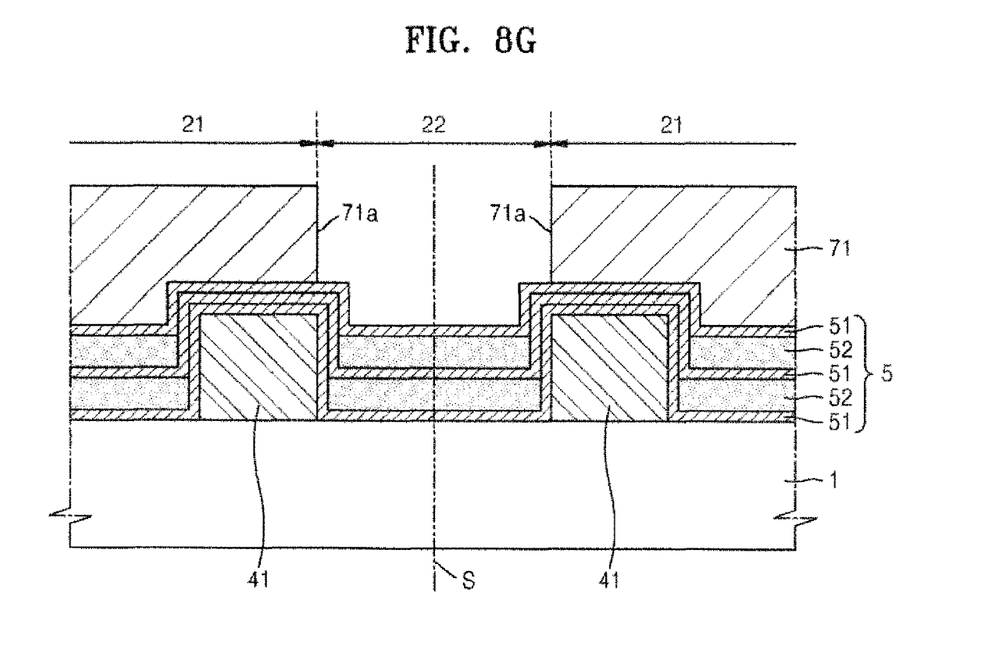

The photoresist 71 of FIG. 8G is patterned by exposing and ashing a mask 72 of FIG. 8F having an opening 72a corresponding to the second region 22. Accordingly, the second region 22 is opened by the photoresist 71.

The substrate 1 is exposed by etching and removing the second region 22 of the sealing structure 5, and thus the structure of FIG. 2 is manufactured. In this regard, an etching solution may be prevented from infiltrating into the sealing structure 5 by the first barriers 41.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. A flat panel display device, comprising:
a substrate including a first region and a second region;
a display unit disposed in the first region on the substrate;
a barrier disposed in the first region on the substrate, disposed on an outer side of the display unit, and disposed adjacent to the second region; and
a sealing structure for covering and sealing the display unit, the sealing structure including at least one first layer comprising an inorganic material and at least one second layer comprising an organic material, said sealing structure contacting the barrier,
wherein a boundary facing the second region of the barrier and a boundary of the sealing structure include same etching surface.

2. The flat panel display device of claim 1, wherein said at least one first layer of the sealing structure is disposed on the barrier.

3. The flat panel display device of claim 1, wherein said at least one second layer of the sealing structure is not disposed on the barrier.

4. The flat panel display device of claim 1, wherein the barrier is spaced apart from the display unit.

5. The flat panel display device of claim 1, wherein a thickness of the barrier is greater than a thickness of the sealing structure.

6. The flat panel display device of claim 1, wherein the sealing structure is not disposed in the second region.

7. The flat panel display device of claim 1, wherein the barrier is not disposed in the second region.

8. The flat panel display device of claim 1, wherein a boundary of the sealing structure and a boundary of the barrier contact each other.

9. The flat panel display device of claim 1, wherein a boundary of the barrier contacts a boundary of the second region.

10. The flat panel display device of claim 1, wherein the second region comprises one of a boundary of the substrate and a pad portion electrically connected to the display unit.

11. A method of manufacturing a flat panel display device, the method comprising the steps of:
preparing a substrate including a first region and a second region;
forming a display unit disposed in the first region on the substrate;
forming a barrier disposed in the first region on the substrate, disposed on an outer side of the display unit, and disposed adjacent to the second region; and
forming a sealing structure for covering and sealing the display unit, said sealing structure including at least one first layer comprising an inorganic material and at least one second layer comprising an organic material, and said sealing structure contacting the barrier,
wherein the forming of the barrier comprises:
forming a third layer in the first region and the second region; and
exposing the second region by patterning the third layer,
wherein the forming of the sealing structure comprises:
forming at least one first layer in the first region and the second region;
forming at least one second layer in the first region and the second region; and
exposing the second region by patterning said at least one first layer and said at least one second layer and patterned third layer.

12. The method of claim 11, wherein the forming of the sealing structure comprises forming said at least one first layer so as to cover the patterned third layer.

13. The method of claim 11, wherein the forming of the sealing structure comprises forming said at least one second layer so as not to cover the patterned third layer.

14. The method of claim 11, wherein a thickness of the third layer is greater than a thickness of the sealing structure.

15. The method of claim 11, wherein the second region comprises one of a boundary of the substrate and a pad portion electrically connected to the display unit.

16. A flat panel display device, comprising:
a substrate including a first region and a second region;
a display unit disposed in the first region on the substrate;
a barrier disposed in the first region on the substrate, disposed on an outer side of the display unit, and disposed adjacent to the second region; and
a sealing structure for covering and sealing the display unit, the sealing structure including at least one first layer comprising an inorganic material and at least one second layer comprising an organic material, said sealing structure contacting the barrier,
wherein the second region comprises a pad portion electrically connected to the display unit, and at least a portion of the pad portion is covered with the barrier,
a boundary facing the second region of the barrier and a boundary of the sealing structure include same etching surface.

* * * * *